(12) United States Patent
Ackeret et al.

(10) Patent No.: US 6,246,060 B1
(45) Date of Patent: Jun. 12, 2001

(54) APPARATUS FOR HOLDING AND ALIGNING A SCANNING ELECTRON MICROSCOPE SAMPLE

(75) Inventors: Michael A. Ackeret, San Jose, CA (US); Jeffry B. Bindell, Orlando, FL (US); Charles E. Bryson, III, Santa Clara, CA (US); Larry E. Plew, St. Cloud; Catherine B. Vartuli, Orlando, both of FL (US); Xiao-Zhong Wu, Fremont, CA (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/197,351

(22) Filed: Nov. 20, 1998

(51) Int. Cl.[7] ..................................................... H01J 37/20
(52) U.S. Cl. .................. 250/442.11; 250/491.1; 250/441.11
(58) Field of Search .......................... 250/442.11, 441.11, 250/491.1

(56) References Cited

U.S. PATENT DOCUMENTS 3,958,124 * 5/1976 Koch et al. ..................... 250/442.11
4,303,866 * 12/1981 Porro et al. ..................... 250/442.11
4,447,731 * 5/1984 Kuni et al. ..................... 250/442.11
5,149,967 * 9/1992 Otaka ............................. 250/442.11
5,303,035 * 4/1994 Luecke et al. ................... 250/442.11

\* cited by examiner

Primary Examiner—Jack Berman
(74) Attorney, Agent, or Firm—David L. Davis

(57) ABSTRACT

Apparatus for holding and aligning a sample to be examined by a scanning electron microscope or the like includes an alignment device having base structure installable in the scanning electron microscope in a predetermined orientation. The alignment device also includes a holder for the sample which is mounted to the base structure for rotative movement about a rotation axis relative to the base structure. An adjuster is mounted on the base structure and can be manipulated to rotate the sample holder about the rotation axis. This alignment device is installed in a base holder and a video camera captures an image of the sample held by the sample holder. The image is displayed on a video monitor and the adjuster is then manipulated to rotatively align the sample to a desired orientation. The alignment device, including the sample, may then be removed from the base holder and installed in the scanning electron microscope with the sample being properly aligned.

12 Claims, 7 Drawing Sheets

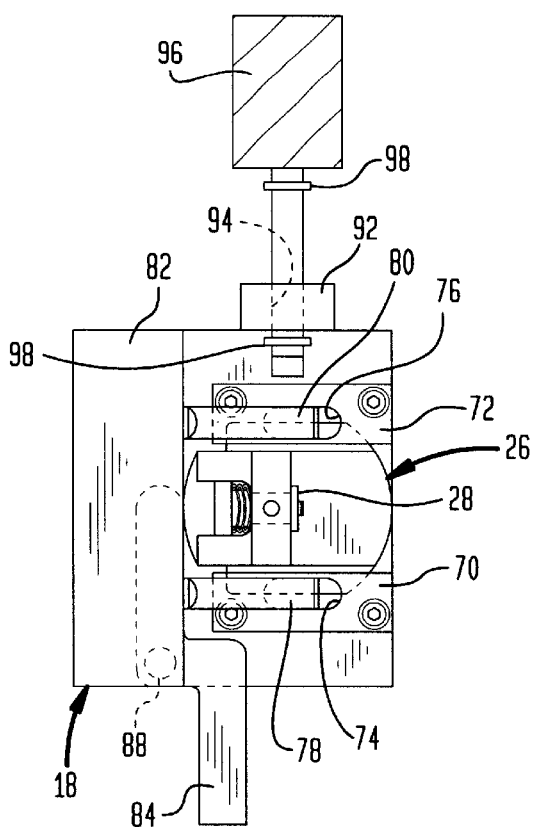
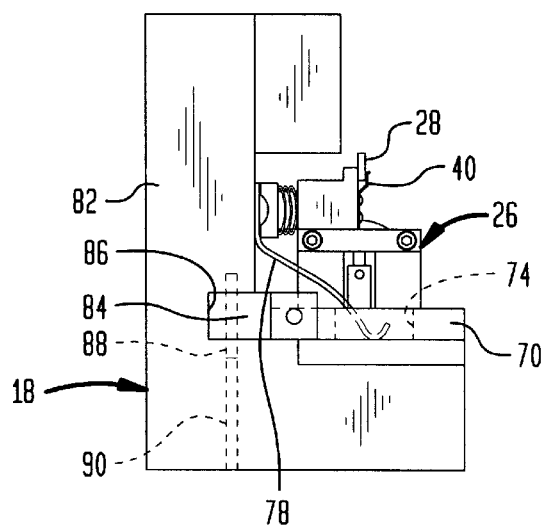
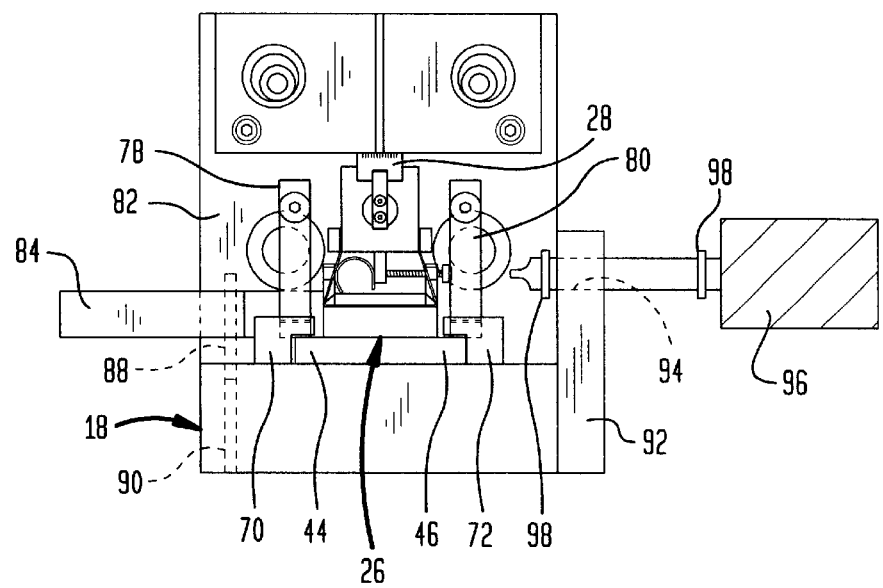

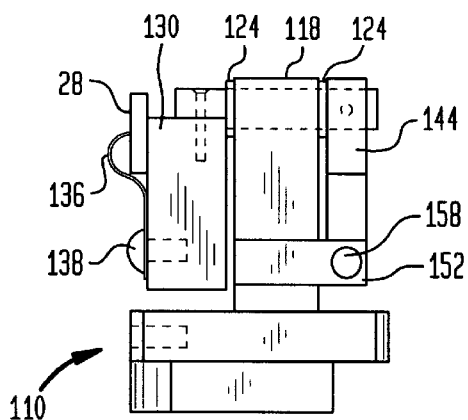
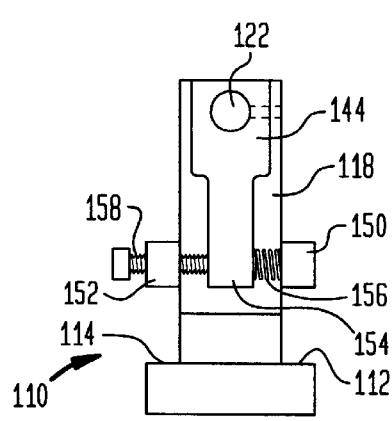
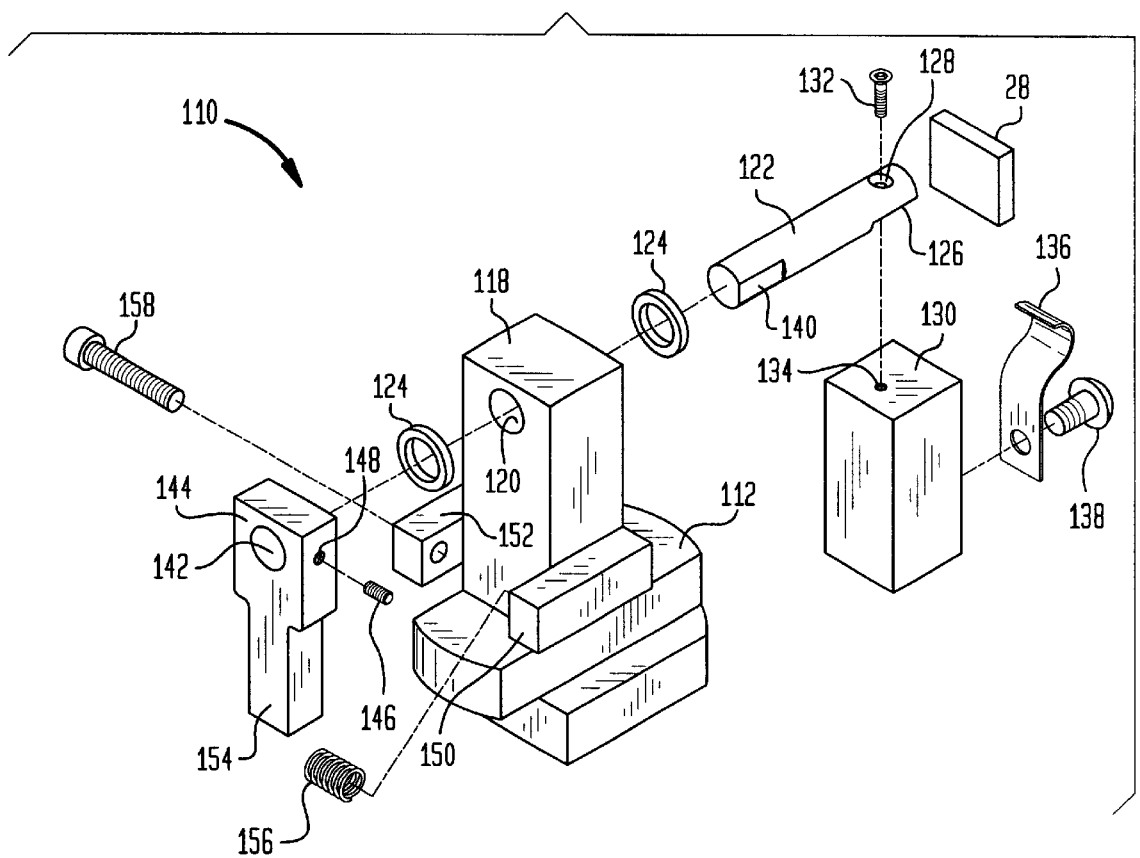

APPARATUS FOR HOLDING AND ALIGNING A SCANNING ELECTRON MICROSCOPE SAMPLE

BACKGROUND OF THE INVENTION

This invention relates to sample alignment for a scanning electron microscope and, more particularly, to apparatus for obtaining the appropriate sample alignment prior to placement of the sample in the scanning electron microscope.

During the manufacture of certain integrated circuit chips, a machine known as a photoresist stepper is utilized to define photoresist lines on the integrated circuit chip wafer. To insure that the stepper is working properly, the widths of the photoresist lines are measured to determine if they meet specifications. In order to do this, the stepper is caused to create an array of parallel lines on a wafer, the wafer is cleaved at a 90° angle to the lines to provide a cross sectional examination sample, and the sample is examined using a scanning electron microscope. To obtain proper measurements, the sample must be held in the scanning electron microscope so that the electron beam is precisely aligned parallel to the photoresist lines. If there is a misalignment, two problems are encountered. First, one edge of the image of each line will be very bright (edge blooming), making it impossible to accurately determine the positions of edges and therefore the widths of the lines. The second problem is that the apparent widths of the lines will be somewhat reduced due to being viewed at an angle. If these measurements are altered by even a small percent, the resulting product can be detrimentally affected. It would therefore be desirable to be able to accurately align a sample for examination in a scanning electron microscope.

In the past, such alignment was effected after the sample was placed in the scanning electron microscope. Present high resolution scanning electron microscopes are not capable of providing easy and accurate alignment of the sample in all angular directions. It would therefore be desirable to have apparatus and a procedure for aligning such a sample prior to its placement in the scanning electron microscope.

SUMMARY OF THE INVENTION

The present invention provides apparatus by means of which a sample can be properly aligned prior to its placement in a scanning electron microscope. The inventive apparatus includes an alignment device adapted to be installed in the scanning electron microscope in a predetermined orientation. The alignment device includes a sample holder which is adapted to hold the sample. The sample holder is mounted to a base structure for rotative movement about a rotation axis relative to the base structure. An adjuster is mounted on the base structure for movement relative thereto. The adjuster is adapted to be manipulated selectively to rotate the sample holder about the rotation axis so that the sample is properly aligned, after which the alignment device can be installed in the scanning electron microscope while holding the properly aligned sample.

In accordance with an aspect of this invention, the alignment device also includes a spring bearing against the base structure to resiliently bias the sample holder for rotative movement in a first direction about the rotation axis. The adjuster is adapted to be manipulated selectively to rotate the sample holder in a second direction about the rotation axis against the bias of the spring or to allow the spring to rotate the sample holder in the first direction.

In accordance with another aspect of this invention, the sample holder includes a projecting member, the base structure includes a first wall, and the spring is positioned between the first wall and the projecting member. The base structure includes a second wall which is substantially parallel to the first wall and on the opposite side of the projecting member from the first wall. The second wall is formed with an internally threaded bore having a central axis transversely intersecting the projecting member. The adjuster includes a threaded rod threadedly extending through the threaded bore along the central axis to engage the projecting member.

In accordance with yet another aspect of this invention, the alignment device further includes a pair of leaf spring members each secured to the base structure and the sample holder to mount the sample holder to the base structure. The pair of leaf spring members are spaced apart each on respective opposed sides of the base structure and the sample holder so that the line of force applied to the sample holder by the spring is transverse to both of the pair of leaf spring members to flex the leaf spring members and cause rotative movement of the sample holder relative to the base structure about the rotation axis parallel to both of the pair of leaf spring members.

In accordance with a further aspect of this invention, there is provided a base holder adapted to hold the alignment device in a predetermined orientation. A video camera is mounted fixedly with respect to the base holder and is positioned to capture an image of a sample held by the sample holder when the alignment device is held by the base holder. A video monitor coupled to the video camera displays an image captured by the video camera. Accordingly, an operator can manipulate the adjuster and view the image of the sample on the video monitor to properly align the sample.

In accordance with yet a further aspect of this invention, the alignment device further includes a shaft journalled for rotation on the base structure parallel to the rotation axis, and an adjustment block secured to the shaft for rotation therewith. The adjustment block includes a projection extending radially outward relative to the shaft and interposed between the spring and the adjuster. The base structure includes a rectilinear upstanding block and the shaft extends through the upstanding block. The sample holder is secured to a first end of the shaft on a first side of the upstanding block, and the adjustment block is secured to a second end of the shaft on a second side of the upstanding block.

In accordance with still a further aspect of this invention, the alignment device further includes a pair of bearing shafts mounted on the base structure parallel to the rotation axis, and a pair of bearing wheels each mounted on a respective one of the pair of bearing shafts. For each set of a bearing shaft and a bearing wheel at least one of the bearing shaft and bearing wheel of that set is journalled for rotation. The sample holder includes a holder block having a support surface shaped as a cylinder segment having a center of curvature aligned with the rotation axis, and with the support surface engaging the pair of bearing wheels.

In accordance with still another aspect of this invention, the adjuster includes an adjusting shaft journalled for rotation on the base structure parallel to the rotation axis, and a linkage connecting the adjusting shaft to the holder block so that rotation of the adjusting shaft moves the support surface on the pair of bearing wheels. The linkage includes an elongated band having its ends fixedly secured to the holder block, with the band having a central portion between its ends tightly wrapped around the adjusting shaft.

Accordingly, rotation of the shaft in a first angular direction causes the holder block to rotate about the rotation axis in a second angular direction opposite to the first angular direction.

BRIEF DESCRIPTION OF THE DRAWINGS

The foregoing will be more readily apparent upon reading the following description in conjunction with the drawings in which like elements in different figures thereof are identified by the same reference numeral and wherein:

FIG. 5 is a top view showing the alignment device shown in FIGS. 2–4 mounted to the inventive base holder;

FIG. 6 is a side view showing the alignment device shown in FIGS. 2–4 mounted to the inventive base holder;

FIG. 7 is a front view showing the alignment device shown in FIGS. 2–4 mounted to the inventive base holder;

FIG. 8 is a side view of a second embodiment of an inventive alignment device;

FIG. 9 is a rear view of the alignment device shown in FIG. 8;

FIG. 10 is an exploded perspective view of a portion of the alignment device shown in FIGS. 8 and 9;

DETAILED DESCRIPTION

According to the present invention, the wafer examination sample is placed in an alignment device which includes a sample holder and base structure, wherein the sample holder is adjustable with respect to the base structure. The alignment device is adapted for a subsequent installation in a scanning electron microscope in a predetermined orientation. When in the scanning electron microscope, the sample should be oriented so that the plane of the wafer is vertical and the photoresist lines are aligned vertically. Before the alignment device is installed in the scanning electron microscope, it is installed in a base holder, where the sample is imaged by a video camera and the image is displayed on a monitor. The video camera is aligned horizontally and is aimed at the photoresist lines on the sample. With the image of the photoresist lines displayed on the monitor, the angular orientation of the sample holder relative to the base structure is manually adjusted until the lines displayed on the monitor are vertically aligned. The alignment device is then removed from the base holder and installed in the scanning electron microscope, maintaining the vertical alignment of the photoresist lines.

Figure 1:
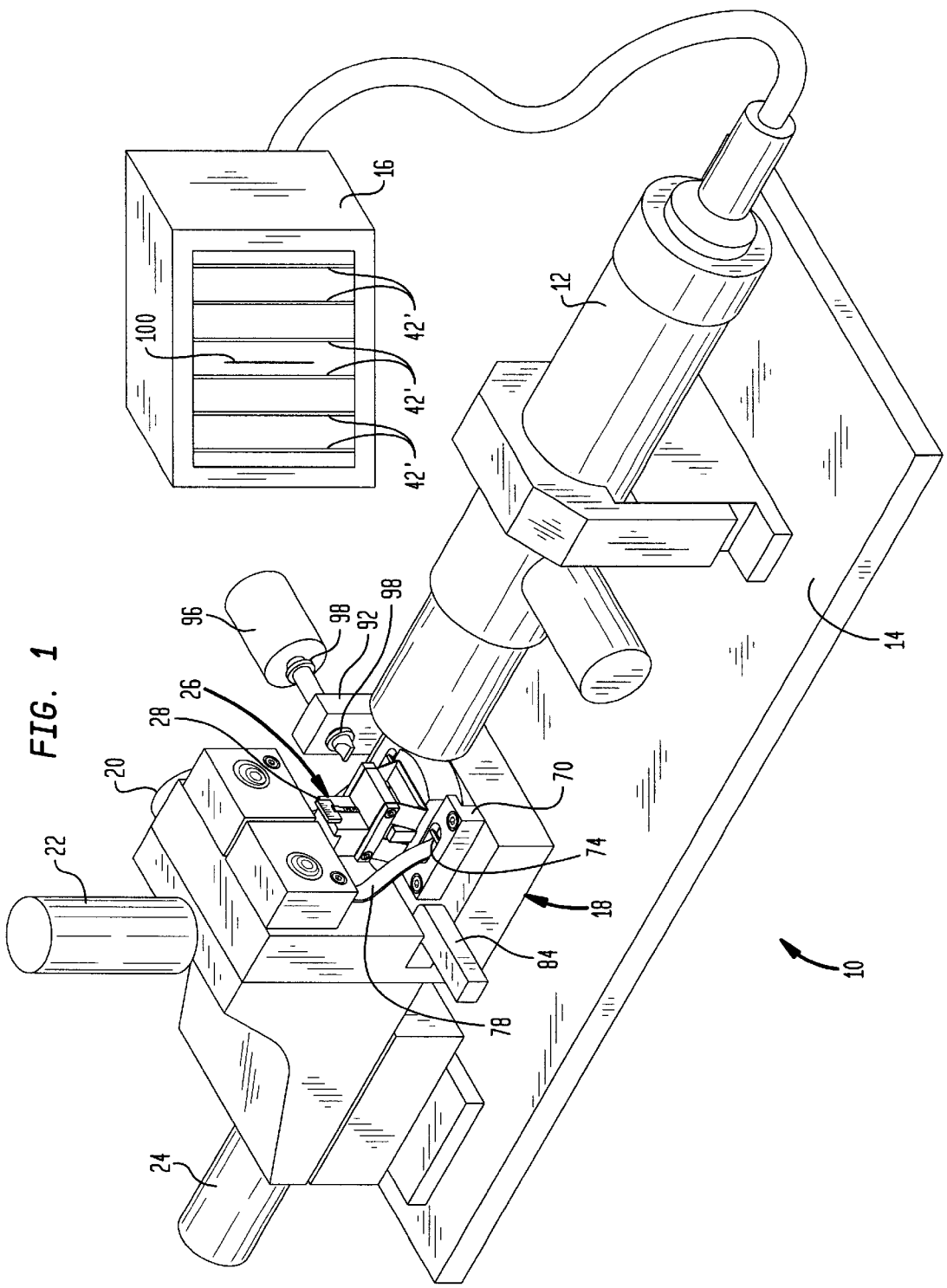
FIG. 1 is a perspective view of an embodiment of the inventive apparatus.

Referring now to FIG. 1, an embodiment of the inventive apparatus, designated generally by the reference numeral 10, includes a video camera 12 mounted to a stand 14 and coupled to a video monitor 16. Also mounted to the stand 14 is a base holder 18, whose position can be varied by means of three goniometers 20, 22, 24 along three orthogonal axes so that the base holder 18 is appropriately aligned relative to the video camera 12 and the sample will be in focus by the video camera 12.

Figure 2:
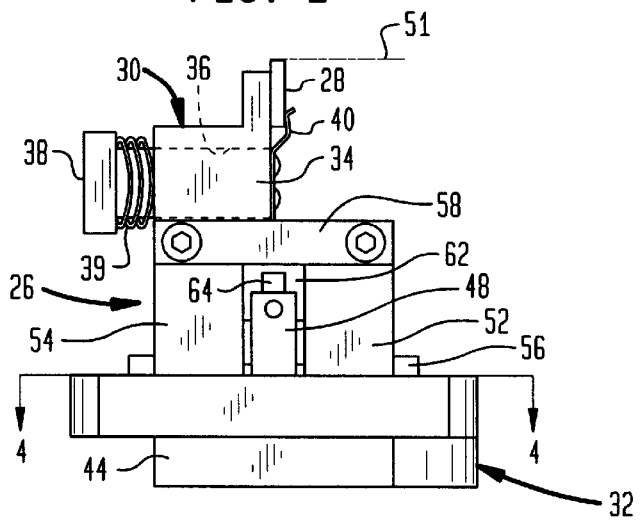
FIG. 2 is a side view of a first embodiment of an inventive alignment device.
Figure 3:
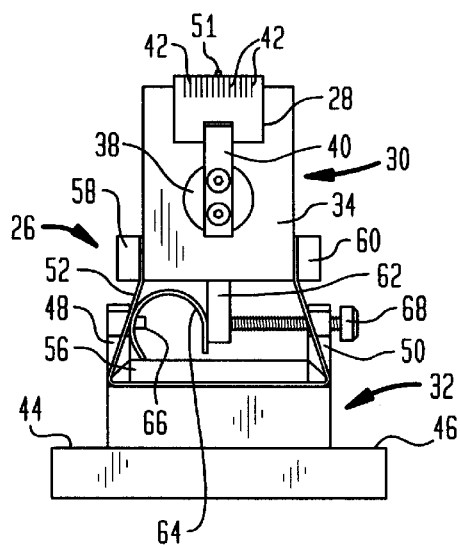
FIG. 3 is a front view of the alignment device shown in FIG. 2.
Figure 4:
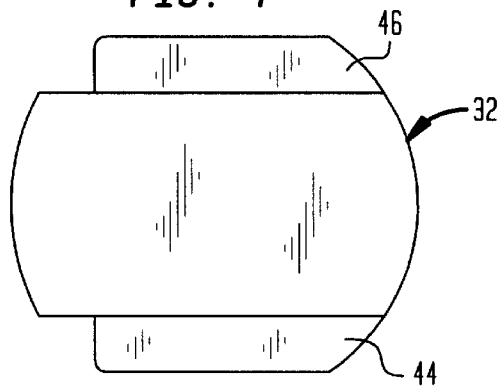
FIG. 4 is a view along the line 4—4 of FIG. 3.
Figure 11:
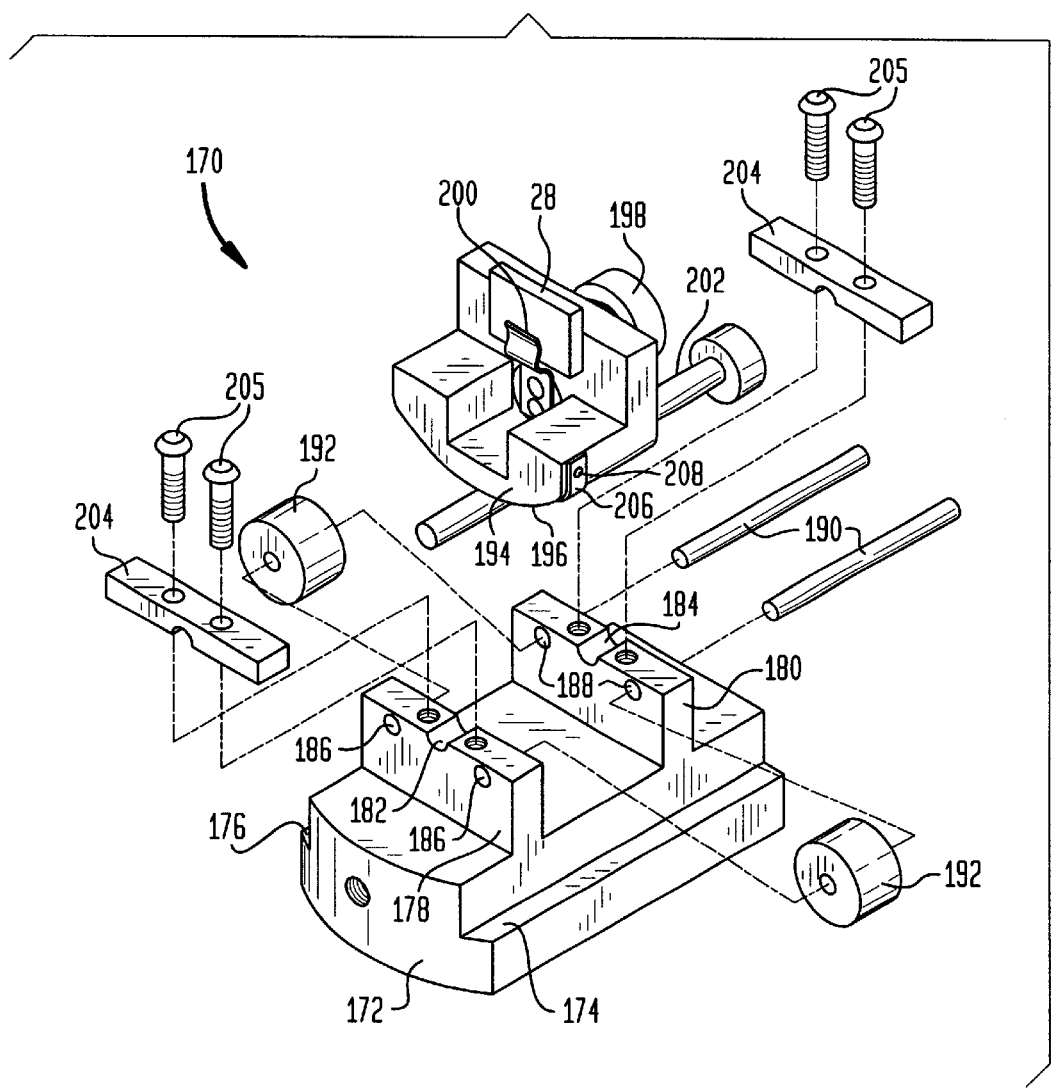
FIG. 11 is an exploded perspective view of a third embodiment of an inventive alignment device.

As shown in FIGS. 2–4, a first embodiment of the alignment device 26, which holds a sample 28 and which in turn is held by the base holder 18 (FIG. 1), includes a sample holder portion 30 and a base structure portion 32. In the following discussion, the relative term "front" refers to that end of the alignment device which holds the sample and the term "rear" refers to the opposite end of the alignment device. The sample holder 30 includes a block 34 having a front-to-back bore 36 in which is inserted a plunger 38 surrounded by a spring 39. At the forward end of the plunger 38, there is mounted a spring clip 40. The spring clip 40 is used to mount the sample 28 to the block 34. As shown in FIG. 3, the sample 28 has a plurality of parallel photoresist lines 42 on its forward-facing surface. It is the lines 42 which are to be aligned vertically. The base structure 32 includes a base block having a pair of lower oppositely directed outwardly extending lateral flanges 44, 46 and a pair of upwardly extending parallel walls 48, 50. The walls 48, 50 are directly across from each other. The illustrated base structure 32, with the flanges 44, 46, is adapted for use with scanning electron microscope Model No. S4700 manufactured by Hitachi, as well as other Hitachi scanning electron microscopes. If another manufacturer's product is used, the base structure would be modified to conform therewith.

The sample holder 30 is mounted to the base structure 32 for rotative movement about a rotation axis 51 adjacent to the upper edge of the sample 28, so that the lines 42 can be angularly adjusted into vertical alignment. To provide such rotative mounting, a pair of leaf spring members 52, 54 are provided, flanking the walls 48, 50. Each of the leaf spring members 52, 54 is bent into a flat bottomed U-shape and is secured to the base structure 32 by having its flat bottom placed beneath the block 56, which is then secured to the base structure main block by screws or the like (not shown) extending through both the block 56 and the leaf spring members 52, 54. The upper ends of the leaf spring members 52, 54 are then secured to the elongated blocks 58, 60, which in turn are secured to the sample holder block 34. The sheets from which the leaf spring members 52, 54 are formed remain parallel to the axis 51, as are all their bend lines and centers of curvature.

Extending below the sample holder block 34 is a projecting member 62, preferably in the form of a centrally located downward fin, or keel. A leaf spring 64 curved into a circular arc is secured to the wall 48, as by the screw 66 or the like, and bears against the fin 62, to resiliently bias the sample holder 30 in a counterclockwise direction about the axis 51, as viewed in FIG. 3. To control this rotative movement of the sample holder 30, an adjuster is provided. This adjuster includes a threaded screw 68 threadedly extending through a threaded bore in the wall 50. The distal end of the screw 68 contacts the fin 62 opposite the point of contact of the spring 64. Accordingly, turning of the screw 68 in a clockwise direction moves the fin 62 to the left, as viewed in FIG.

3, to overcome the biasing effect of the spring 64 and rotate the sample holder 30 in a clockwise direction about the axis 51. Conversely, turning the screw 68 in a counterclockwise direction allows the spring 64 to rotate the sample holder 30 in a counterclockwise direction about the axis 51. This structure provides an adjustability of approximately ±5° for the lines 42 about a point (i.e., the axis 51) closely adjacent the upper edge of the sample 28.

To align the lines 42 on the sample 28, the alignment device 26 is installed in the base holder 18. As shown in FIGS. 5–7, the base holder 18 is provided with a pair of L-shaped members 70, 72 which provide a pair of channels adapted to slidingly receive therein the flanges 44, 46 of the base structure 32 of the alignment device 26. Each of the L-shaped members 70, 72, has a respective open slot 74, 76 into which extends an end of a respective spring 78, 80, the other end of which is secured to the upstanding wall 82 of the base holder 18. Thus, when the flanges 44, 46 are inserted in the channels of the base holder 18, they are engaged by the respective spring 78, 80 to maintain their positions.

The base holder 18 is further provided with a lever 84. Part of the lever 84 extends away from the base holder 18, while another part is received in a channel 86 in the wall 82. The lever 84 is pivoted about a screw 88 installed in a bore 90 extending upwardly through the wall 82 from the bottom of the base holder 18. When the alignment device 26 is installed in the base holder 18, the rear of the base structure 32 is up against the lever 84, as best shown in FIG. 5. When it is desired to remove the alignment device 26 from the base holder 18, the part of the lever 84 extending out of the base holder 18 is pushed to the left, as viewed in FIG. 5, to engage the base structure 32 and push the pair of flanges 44, 46 outwardly from the channels formed by the L-shaped members 70, 72.

The base holder 18 also includes a side wall 92 having a bore 94 axially aligned with the screw 68 of the alignment device 26 when the alignment device 26 is installed in the base holder 18. A screwdriver 96 is captured in the bore 94, as by C-clips 98 or the like and is free to rotate within the bore 90. The screwdriver 96 is aligned with the screw 68 and has a head which is complemental to the head of the screw 68 so that the screwdriver 96 is used to provide the angular adjustment of the sample 28.

In operation, a sample 28 is placed in the alignment device 26 by depressing the plunger 38 to release the spring clip 40 and then placing the sample 28 below the spring clip 40 with the lines 42 being at the top of the sample 28 and being as close to vertical alignment as possible when viewed with the naked eye. This alignment should be within ±5° of vertical. The alignment device 26 is then installed in the base holder 18 by sliding the flanges 44, 46 into the channels formed by the L-shaped members 70, 72. An image of the lines 42 is then viewed on the monitor 16, these lines being denoted by the reference numeral 42' in FIG. 1. The screen of the monitor 16 is provided with a fixed reference mark 100, which a vertical line. The screwdriver 96 is then moved inwardly to engage the head of the screw 68 and the sample holder 30 is rotated about the axis 51 by turning the screw 68 until the images 42' are parallel to the reference mark 100. When the sample 28 has been manually adjusted in the alignment device 26 to within +5° of vertical alignment, it has been found that the inventive apparatus allows for alignment to within +0.1° of the desired vertical alignment. After this alignment is achieved, the lever 84 is pivoted to remove the alignment device 26 from the base holder 18. The entire alignment device 26, along with the sample 28, is then installed in the scanning electron microscope to analyze the operation of the photoresist stepper.

FIGS. 8–10 illustrate a second embodiment of an inventive alignment device, designated generally by the reference numeral 110. The alignment device 110 is adapted for insertion into the base holder 18 in the same manner as the alignment device 26 and therefore includes base structure having similarly configured outwardly extending lateral flanges 112, 114. Thus, as shown, the alignment device 110 includes base structure 116 having a rectilinear standing block 118. The block 118 is formed with a through-bore 120 extending from the front to the back of the block 118. A rotary shaft 122 extends through the bore 120 for rotation therein, with spacers 124 mounted on the shaft 122, one on each side of the block 118. The shaft 122 has a flat portion 126 at its front end and a bore 128 drilled through the shaft 122 orthogonally to the flat portion 126. A sample holder block 130 is secured to the flat portion 126 of the shaft 122 by the screw 132 extending through the bore 128 and an internally threaded bore 134 at the top surface of the sample holder block 130. The sample 28 is held to the front of the sample holder block 130 by the spring clip 136 held at the front of the sample holder block 130 by the screw 138. The sample 28 is held so that its upper edge is closely adjacent the rotational axis defined by the center of the shaft 122.

The rear end of the shaft 122 is formed with a flat portion 140 which is orthogonal to the flat portion 126. The flat portion 140 extends into the front-to-back bore 142 of the adjustment block 144, and a set screw 146 extending through the internally threaded bore 148 is used to secure the adjustment block 144 to the shaft 122 for rotation therewith.

Secured to opposed sides of the block 118 and extending rearwardly therefrom are side walls 150, 152. The side walls 150, 152 flank the downwardly extending projection 154 of the adjustment block 144. The projection 154 extends radially outward relative to the shaft 122. A spring 156, illustratively a helical compression spring, is secured to the side wall 150, as by a screw or the like (not shown), and a threaded adjustment screw 158 extends through an internally threaded bore in the side wall 152. The spring 156 and the adjustment screw 158 are opposed to each other and contact the projection 154 on respective opposite sides thereof.

Use of the alignment device 110 is the same as use of the alignment device 26 and no further explanation thereof is necessary.

FIGS. 11–15 illustrate a third embodiment of an inventive alignment device, designated generally by the reference numeral 170. The alignment device 170 includes base structure 172 having outwardly extending lateral flanges 174, 176 so that it can be inserted into the base holder 18. The base structure 172 also includes a pair of upstanding transverse walls 178, 180. The upper surface of each of the walls 178, 180 is substantially planar, in the same horizontal plane, with the exception of a central circular groove 182, 184, respectively. The grooves 182, 184 are aligned one with the other and are of the same size. The front wall 178 is formed with a pair of front-to-back bores 186 which are equally spaced laterally with respect to the groove 182. Similarly, the rear wall 180 is formed with a pair of front-to-back bores 188 which are equally spaced laterally with respect to the groove 184. Each of the bores 186 is aligned with a respective one of the bores 188 and is of the same size. A pair of bearing shafts 190 each extends through a respective pair of bores 186, 188 and has mounted thereon a respective bearing wheel 192 between the walls 178, 180. For each set of bearing shaft 190 and bearing wheel 192, at least one of the bearing shaft 190 and the bearing wheel 192 of that set is journalled for rotation.

The alignment device 170 also includes a sample holder having a holder block 194 which has a support surface 196 shaped as a cylinder segment having a center of curvature aligned with the top edge of the sample 28, which has the rotation axis of the holder block 194, as will be described. The sample 28 is held to the holder block 194 by an arrangement similar to that of the alignment device 26, with a spring loaded plunger 198 extending through the holder block 194 to a spring clip 200.

Figure 12:
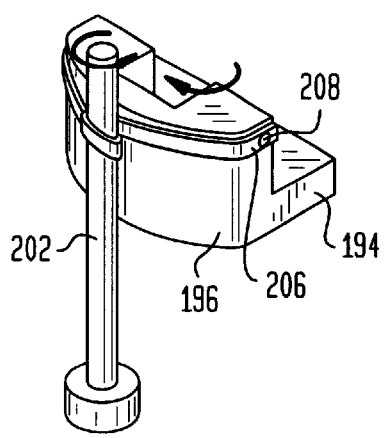
FIG. 12 is a partial perspective view showing an illustrative linkage between the adjuster shaft and the holder block of the alignment device shown in FIG. 11.
Figure 13:
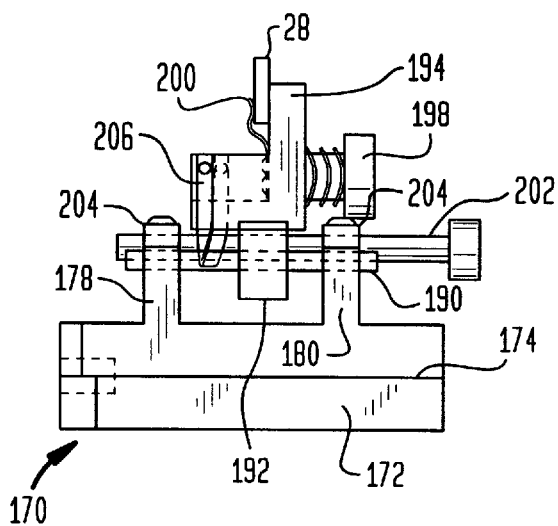
FIG. 13 is a side view of the assembled alignment device shown in FIG. 11.
Figure 14:
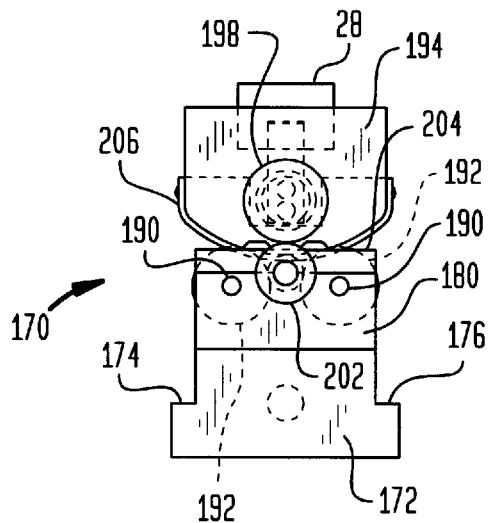
FIG. 14 is a rear view of the assembled alignment device shown in FIG. 11.
Figure 15:
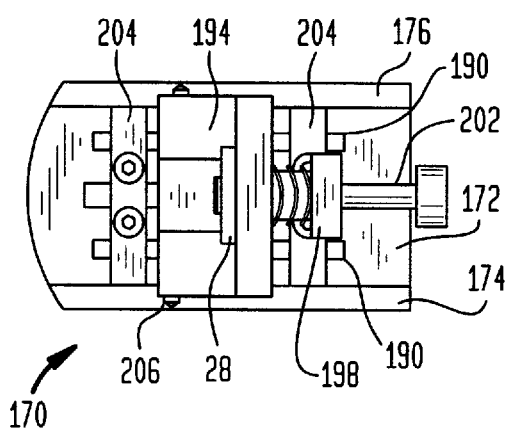
FIG. 15 is a top view of the assembled alignment device shown in FIG. 11.

To effect rotation of the holder block 194, there is provided an adjusting shaft 202 journalled for rotation on the base structure 172. Specifically, the adjusting shaft 202 is positioned in the grooves 182, 184 and is held therein by the pillow blocks 204, which are secured to the walls 178, 180 as by screws 205 or the like. A linkage is provided between the adjusting shaft 202 and the holder block 194. Illustratively, this linkage includes an elongated band 206, which may be formed of stainless steel, having its ends secured to the sides of the holder block 194, as by screws 208 or the like. A central portion of the band 206 is wrapped tightly around the adjusting shaft 202, as best shown in FIG. 12. For assembly, the holder block 194, with the adjusting shaft 202 and the band 206, is placed on the base structure 172, with the shaft 202 disposed in the grooves 182, 184 and the support surface 196 of the holder block 194 resting on the bearing wheels 192. The pillow blocks 204 are then installed. Accordingly, rotation of the shaft 202 in a first angular direction causes the holder block 194 to rotate about its center of curvature (i.e., the rotation axis) in a second angular direction opposite to the first angular direction, as shown by the arrows in FIG. 12.

Alignment of the sample 28 using the alignment device 170 is substantially the same as when using the aforedescribed alignment device 26, with the exception that the adjusting shaft 202 is accessed from either the front or the rear of the alignment device 170, instead of from the side of the alignment device 26.

Figure 16:
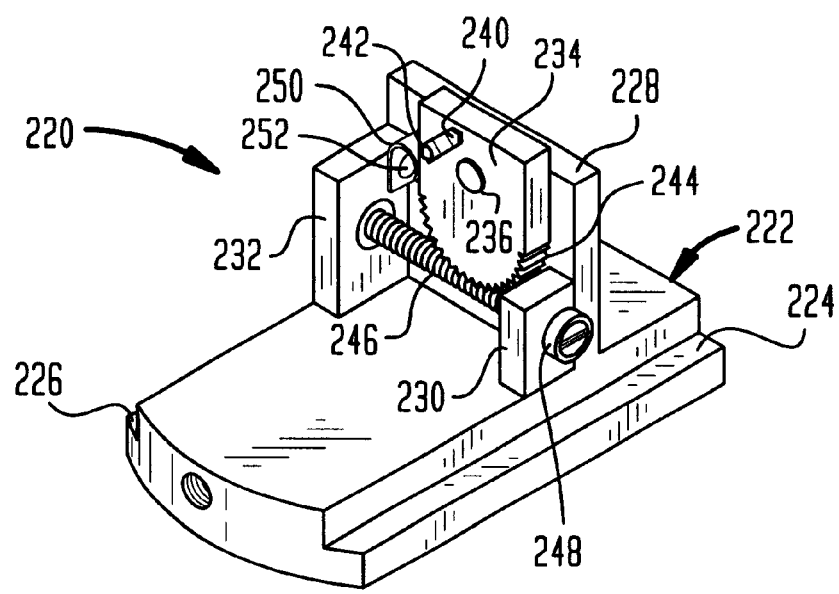
FIG. 16 is a perspective view of a fourth embodiment of an inventive alignment device.
Figure 17:
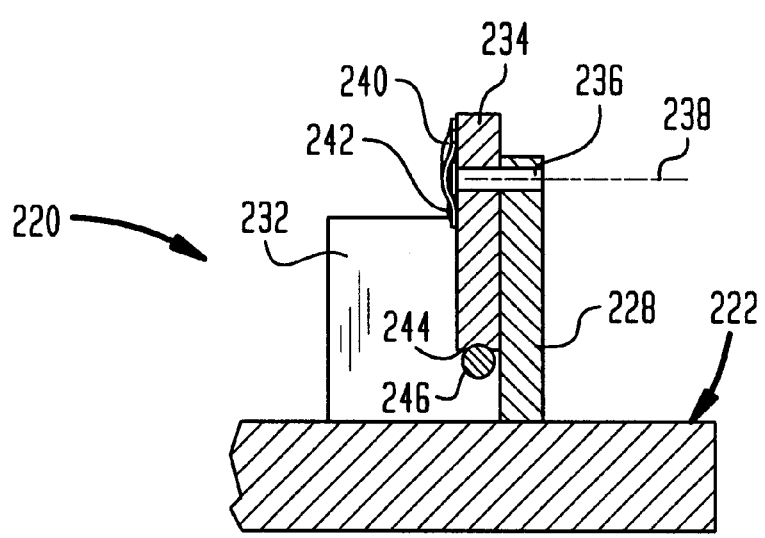
FIG. 17 is a longitudinal cross sectional view through the alignment device shown in FIG. 16.

FIGS. 16 and 17 illustrate a fourth embodiment of an inventive alignment device, designated generally by the reference numeral 220. The alignment device 220 includes base structure 222 having outwardly extending lateral flanges 224, 226 so that it can be inserted into the base holder 18. The base structure 222 also includes a first upstanding wall 228 and a pair of upstanding walls 230, 232 which are spaced apart and orthogonal to the wall 228.

The alignment device 220 also includes a sample holder having a holder block 234. The block 234 is pivotally mounted to the wall 228, as by a bushing 236 or the like, to afford rotation about the axis 238. Thus, the axis 238 is orthogonal to the wall 228 and parallel to the walls 230, 232. The sample 28 is held to the front of the sample holder block 234 by the spring clip 240 which is held at the front of the sample holder block 234 by the screw 242. The sample holder block 234 has a portion of its periphery formed as an arcuate segment of a worm wheel, as denoted by the reference numeral 244. The worm wheel arcuate segment 244 is centered at the rotation axis 238.

To effect rotation of the sample holder block 234, there is provided a worm gear 246 mounted to the walls 230, 232 for rotation without longitudinal motion. The worm gear 246 is parallel to the wall 228 and is intermeshed with the worm wheel arcuate segment 244. An end portion 248 of the worm gear 246 is accessible at the wall 230 and is formed to be complementary to the screwdriver 96 so that manipulation of the screwdriver 96 results in rotation of the worm gear 246 and subsequent rotation of the sample holder block 234 about the rotation axis 238.

The alignment device 220 also includes a leaf spring 250 secured at one end to the wall 232, as by a screw 252 or the like. The other end of the leaf spring 250 bears against the sample holder block 234 to maintain a tight engagement between the worm wheel arcuate segment 244 and the worm gear 246, to limit their relative freedom of movement.

Use of the alignment device 220 is the same as use of the alignment device 26 and no further explanation thereof is necessary.

Accordingly, there has been disclosed improved apparatus for holding and aligning a scanning electron microscope sample. While several illustrative embodiments of the present invention have been disclosed herein, it is understood that various modifications and adaptations to the disclosed embodiments are possible, and it is intended that this invention be limited only by the scope of the appended claims.

What is claimed is:

1. Apparatus for holding and aligning a sample to be examined by a scanning electron microscope comprising an alignment device including:

base structure adapted to be installed in said scanning electron microscope in a predetermined orientation;

a sample holder adapted to hold said sample and mounted to said base structure for rotative movement about a rotation axis relative to said base structure;

an adjuster mounted on said base structure for movement relative thereto and adapted to be manipulated selectively to rotate said sample holder about said rotation axis; and a spring bearing against said base structure and adapted to resiliently bias said sample holder for rotative movement in a first direction about said rotation axis;

wherein:

said adjuster is adapted to be manipulated selectively to rotate said sample holder in a second direction about said rotation axis against the bias of said spring or to allow said spring to rotate said sample holder in said first direction;

said sample holder includes a projecting member;

said base structure includes a first wall;

said spring is positioned between said first wall and said projecting member;

said base structure includes a second wall substantially parallel to said first wall and on the opposite side of said projecting member from said first wall, said second wall being formed with an internally threaded bore having a central axis transversely intersecting said projecting member; and said adjuster includes a threaded rod threadedly extending through said threaded bore along said central axis to engage said projecting member.

2. Apparatus for holding and aligning a sample to be examined by a scanning electron microscope, comprising an alignment device including:

base structure adapted to be installed in said scanning electron microscope in a predetermined orientation;

a sample holder adapted to hold said sample and mounted to said base structure for rotative movement about a rotation axis relative to said base structure;

an adjuster mounted on said base structure for movement relative thereto and adapted to be manipulated selectively to rotate said sample holder about said rotation axis;

a spring bearing against said base structure and adapted to resiliently bias said sample holder for rotative movement in a first direction about said rotation axis;

a shaft journalled for rotation on said base structure parallel to said rotation axis; and an adjustment block secured to said shaft for rotation therewith, said adjustment block including a projection extending radially outward relative to said shaft and interposed between said spring and said adjuster;

wherein said adjuster is adapted to be manipulated selectively to rotate said sample holder in a second direction about said rotation axis against the bias of said spring or to allow said spring to rotate said sample holder in said first direction; and wherein said sample holder is secured to said shaft for rotation therewith.

3. The apparatus according to claim 2 wherein:

said base structure includes a first wall;

said spring is positioned between said first wall and said adjustment block projection;

said base structure includes a second wall substantially parallel to said first wall and on the opposite side of said projection from said first wall, said second wall being formed with an internally threaded bore having a central axis transversely intersecting said projection; and said adjuster includes a threaded rod threadedly extending through said threaded bore along said central axis to engage said projection.

4. The apparatus according to claim 3 wherein:

said base structure includes a rectilinear upstanding block;

said shaft extends through said upstanding block;

said sample holder is secured to a first end of said shaft on a first side of said upstanding block;

said adjustment block is secured to a second end of said shaft on a second side of said upstanding block;

said first wall extends parallel to said shaft from a third side of said upstanding block; and said second wall extends parallel to said first wall from a fourth side of said upstanding block.

5. Apparatus for holding and aligning a sample to be examined by a scanning electron microscope, comprising an alignment device including:

base structure adapted to be installed in said scanning electron microscope in a predetermined orientation;

a sample holder adapted to hold said sample and mounted to said base structure for rotative movement about a rotation axis relative to said base structure;

an adjuster mounted on said base structure for movement relative thereto and adapted to be manipulated selectively to rotate said sample holder about said rotation axis; and a pair of leaf spring members each secured to said base structure and said sample holder to mount said sample holder to said base structure, said pair of leaf spring members being spaced apart each on respective opposed sides of said base structure and said sample holder so that the line of force applied to said sample holder by said spring is transverse to both of said pair of leaf spring members to flex said leaf spring members and cause rotative movement of said sample holder relative to said base structure about said rotation axis parallel to both of said pair of leaf spring members.

6. Apparatus for holding and aligning a sample to be examined by a scanning electron microscope, comprising an alignment device including:

base structure adapted to be installed in said scanning electron microscope in a predetermined orientation;

a sample holder adapted to hold said sample and mounted to said base structure for rotative movement about a rotation axis relative to said base structure;

an adjuster mounted on said base structure for movement relative thereto and adapted to be manipulated selectively to rotate said sample holder about said rotation axis;

a pair of bearing shafts mounted on said base structure parallel to said rotation axis; and a pair of bearing wheels each mounted on a respective one of said pair of bearing shafts, wherein for each set of a bearing shaft and a bearing wheel at least one of the bearing shaft and bearing wheel of that set is journalled for rotation; and wherein said sample holder includes a holder block having a support surface shaped as a cylinder segment having a center of curvature aligned with said rotation axis, with said support surface engaging said pair of bearing wheels.

7. The apparatus according to claim 6 wherein said adjuster includes:

an adjusting shaft journalled for rotation on said base structure; and a linkage connecting said adjusting shaft to said holder block so that rotation of said adjusting shaft moves said support surface on said pair of bearing wheels.

8. The apparatus according to claim 7 wherein:

said adjusting shaft is journalled for rotation parallel to said rotation axis; and said linkage includes an elongated band having its ends fixedly secured to said holder block, said band having a central portion between its ends tightly wrapped around said adjusting shaft;

whereby rotation of said shaft in a first angular direction causes said holder block to rotate about said rotation axis in a second angular direction opposite to said first angular direction.

9. Apparatus for holding and aligning a sample to be examined by a scanning electron microscope, comprising an alignment device including:

base structure adapted to be installed in said scanning electron microscope in a predetermined orientation;

a sample holder adapted to hold said sample and mounted to said base structure for rotative movement about a rotation axis relative to said base structure;

an adjuster mounted on said base structure for movement relative thereto and adapted to be manipulated selectively to rotate said sample holder about said rotation axis;

wherein:

said adjuster includes a rotatable first gear;

said sample holder includes a second gear intermeshed with said first gear and rotatable about said rotation axis;

said first gear is a worm gear; and said second gear includes a portion of said sample holder formed as an arcuate segment of a worm wheel centered at said rotation axis;

and further including:

a spring member interposed between said base structure and said sample holder to maintain engagement of said first and second gears.

10. Apparatus for holding and aligning a sample to be examined by a scanning electron microscope, comprising an alignment device including:
- base structure adapted to be installed in said scanning electron microscope in a predetermined orientation;
- a sample holder adapted to hold said sample and mounted to said base structure for rotative movement about a rotation axis relative to said base structure;
- an adjuster mounted on said base structure for movement relative thereto and adapted to be manipulated selectively to rotate said sample holder about said rotation axis; and
- a spring member having a first end secured to one of said second and third walls and a second end engaging said sample holder block;

wherein:

said adjuster includes a rotatable first gear;

said sample holder includes a second gear intermeshed with said first gear and rotatable about said rotation axis;

said base structure includes a first wall orthogonal to said rotation axis, a second wall orthogonal to said first wall and parallel to said rotation axis, and a third wall parallel to and spaced form said second wall;

said adjuster includes a worm gear mounted to said second and third walls for rotation without longitudinal motion, the axis of said worm gear being parallel to said first wall; and said sample holder includes a block mounted to said first wall for rotation about said rotation axis, said block having a portion of its periphery formed as an arcuate segment of a worm wheel centered at said rotation axis and with said segment engaging said worm gear;

whereby tight engagement is maintained between said worm gear and said worm wheel arcuate segment.

11. Apparatus for holding and aligning a sample to be examined by a scanning electron microscope, comprising an alignment device including:
- base structure adapted to be installed in said scanning electron microscope in a predetermined orientation;
- a sample holder adapted to hold said sample and mounted to said base structure for rotative movement about a rotation axis relative to said base structure;
- an adjuster mounted on said base structure for movement relative thereto and adapted to be manipulated selectively to rotate said sample holder about said rotation axis;
- a base holder adapted to hold said base structure in a predetermined orientation;
- a video camera mounted fixedly with respect to said base holder and positioned to capture an image of a sample held by said sample holder when said base structure is held by said base holder; and
- a video monitor coupled to said video camera and adapted to display an image captured by said video camera said base holder further includes a pair of spring members each adapted to engage a respective base structure flange when said pair of flanges are received in said pair of channels;

wherein:

said base structure includes a pair of oppositely directed outwardly extending lateral flanges;

said base holder includes a pair of channels adapted to slidingly receive said pair of flanges; and said base holder further includes a pair of spring members each adapted to engage a respective base structure flange when said pair of flanges are received in said pair of channels.

12. Apparatus for holding and aligning a sample to be examined by a scanning electron microscope, comprising an alignment device including:
- base structure adapted to be installed in said scanning electron microscope in a predetermined orientation;
- a sample holder adapted to hold said sample and mounted to said base structure for rotative movement about a rotation axis relative to said base structure;
- an adjuster mounted on said base structure for movement relative thereto and adapted to be manipulated selectively to rotate said sample holder about said rotation axis;
- a base holder adapted to hold said base structure in a predetermined orientation;
- a video camera mounted fixedly with respect to said base holder and positioned to capture an image of a sample held by said sample holder when said base structure is held by said base holder; and
- a video monitor coupled to said video camera and adapted to display an image captured by said video camera said base holder further includes a pair of spring members each adapted to engage a respective base structure flange when said pair of flanges are received in said pair of channels;

wherein:

said base structure includes a pair of oppositely directed outwardly extending lateral flanges;

said base holder includes a pair of channels adapted to slidingly receive said pair of flanges; and said base holder further includes a pivotally mounted lever adapted for selective pivoting to engage said base structure and push said pair of flanges outwardly from said pair of channels.

* * * * *